United States Patent [19]
Hinks

[11] Patent Number: 5,280,244
[45] Date of Patent: Jan. 18, 1994

[54] GRADIENT MOMENT NULLING IN A FAST SPIN ECHO NMR PULSE SEQUENCE

[75] Inventor: Richard S. Hinks, Waukesha, Wis.

[73] Assignee: General Electric Company, Milwaukee, Wis.

[21] Appl. No.: 854,515

[22] Filed: Mar. 19, 1992

[51] Int. Cl.$^5$ ............................................. G01R 33/20
[52] U.S. Cl. ..................................... 324/306; 324/309
[58] Field of Search ........................ 324/300, 306, 307, 309, 324/310, 311, 312, 313, 314, 318, 322; 128/653 A

[56] References Cited

U.S. PATENT DOCUMENTS

| | | | |
|---|---|---|---|
| 4,706,026 | 11/1987 | Pelc et al. | 324/309 |
| 4,731,583 | 3/1988 | Glover et al. | 324/309 |
| 4,970,465 | 11/1990 | Hagiwara | 324/309 |
| 4,973,906 | 11/1990 | Bernstein | 324/309 |
| 4,978,918 | 12/1990 | Sakamoto | 324/309 |
| 5,142,231 | 8/1992 | Jensen et al. | 324/309 |
| 5,170,122 | 12/1992 | Bernstein | 324/309 |

FOREIGN PATENT DOCUMENTS

| | | |
|---|---|---|
| 0175184 | 3/1986 | European Pat. Off. . |
| 0222325 | 5/1987 | European Pat. Off. . |

OTHER PUBLICATIONS

A Progressive Gradient Moment Nulling Design Technique, J. G. Pipe & T. L. Chenevert, *Mag. Resonance in Medicine*, May 1991, No. 1, pp. 175–179.

Reduction of Flow Artifacts in Fast Gradient-Recalled Echo Imaging by the Use of Prefocused Pulses, A. R. C. Gates, et al., *Journ. of Mag. Res.*, Jan. 1992, No. 1, pp. 222–228.

Flow-Velocity Imaging from Linear Regression of Phase Images with Techniques for Reducing Eddy-Current Effects, *Journal of Magnetic. Res.*, Oct. 1990, No. 1, pp. 71–89.

*Primary Examiner*—Michael J. Tokar
*Attorney, Agent, or Firm*—Quarles & Brady

[57] ABSTRACT

Image artifacts caused by flowing spins during a fast spin echo pulse sequence are suppressed by employing gradient moment nulling. The first moment of one or more gradients is nulled at each RF refocusing pulse in the sequence, and in alternative embodiments, the first moment is also nulled at each acquired NMR echo signal.

8 Claims, 5 Drawing Sheets

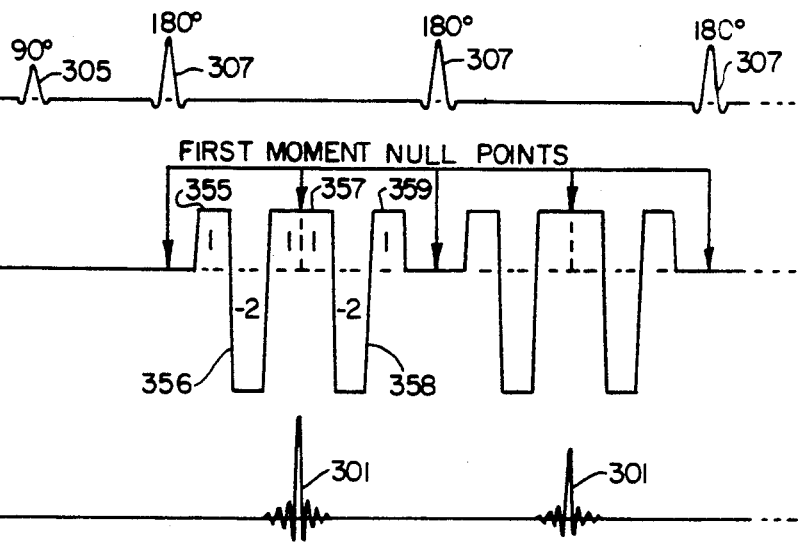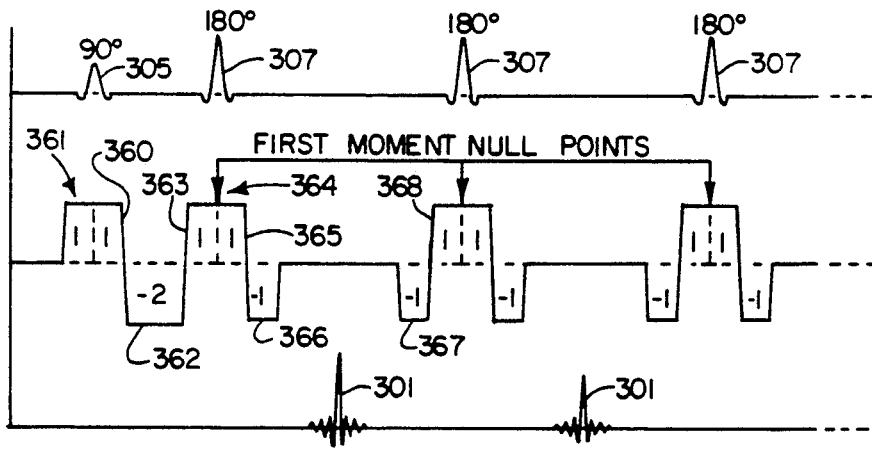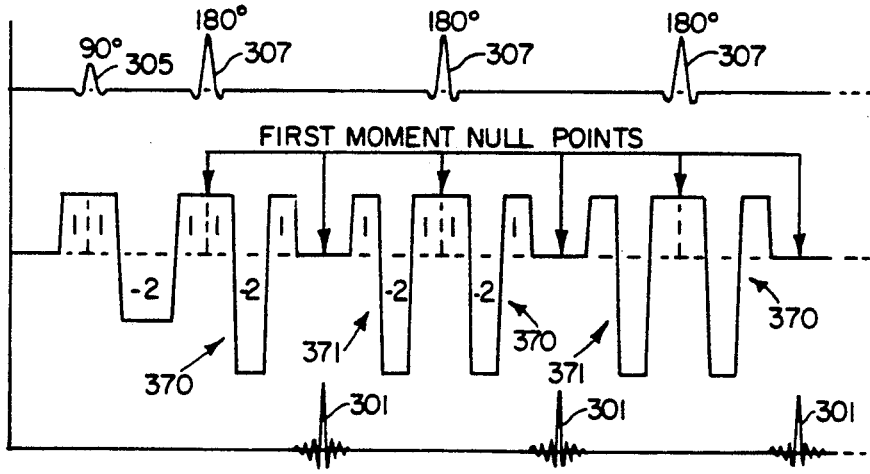

GRADIENT MOMENT NULLING IN A FAST SPIN ECHO NMR PULSE SEQUENCE

BACKGROUND OF THE INVENTION

The field of the invention is nuclear magnetic resonance imaging methods and systems. More particularly, the invention relates to the reduction of motion artifacts in NMR images produced using Carr-Purcell-Meiboom-Gill (CPMG) pulse sequences.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$ which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance (NMR) phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Most NMR scans currently used to produce medical images require many minutes to acquire the necessary data. The reduction of this scan time is an important consideration, since reduced scan time increases patient throughput, improves patient comfort, and improves image quality by reducing motion artifacts. There is a class of pulse sequences in which a complete scan can be conducted in seconds rather than minutes.

The concept of acquiring NMR image data in a short time period has been known since 1977 when the echo-planar pulse sequence was proposed by Peter Mansfield (J. Phys. C.10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and variations on this pulse sequence are disclosed in U.S. Pat. No. 4,678,996; 4,733,188; 4,716,369; 4,355,282; 4,588,948 and 4,752,735.

One variant of the echo planar imaging method is the Rapid Acquisition Relaxation Enhanced (RARE) sequence which is described by J. Hennig et al in an article in *Magnetic Resonance In Medicine* 3,823-833 (1986) entitled "RARE Imaging: A Fast Imaging Method For Clinical MR." The essential difference between the RARE sequence and the EPI sequence lies in the manner in which echo signals are produced. The RARE sequence utilizes RF refocused echoes generated from a Carr-Purcell-Meiboom-Gill (CPMG) sequence, while EPI methods employ gradient recalled echoes.

Movement of the spins being imaged can produce artifacts in the reconstructed image. Such movement may occur, for example, by patient respiration during the scan or it may occur during each pulse sequence as a result of CSF and blood flow. Flowing spins can introduce phase errors into the acquired NMR data set which result in the production of ghosts or in blurring of the reconstructed image. Such errors are particularly troublesome with CPMG sequences and the image artifacts are, at times, worse than with images reconstructed from conventionally acquired NMR pulse sequences.

One method for reducing motion artifacts in conventionally acquired NMR images is referred to in the art as "gradient moment nulling". This method requires the addition of gradient pulses to the pulse sequence which cancel, or null, the effect on the NMR signal phase caused by spins moving in the gradients employed for position encoding. Such a solution is disclosed, for example, in U.S. Pat. No. 4,731,583 entitled "Method For Reduction of NMR Image Artifacts Due To Flowing Nuclei By Gradient Moment Nulling". Other references which describe gradient moment nulling in NMR pulse sequences include:

P. M. Pattany, J. J. Phillips, L. C. Chiu, J. D. Lipcamon, J. L. Duerk, J. M. McNally, S. N. Mohapatra, *J. Comput. Assit. Tomogr.* 11: 367–377 (1987).

E. M. Haake, G. W. Lenz, *Am. J. Roentgenology* 148: 1251–1258 (1987).

D. G. N'ishimura, J. I. Jackson, J. M. Pauly, *Mag. Res. Med.* 22: 481–492 (1991).

J. L. Duerk, O. P. Simonetti, *J. Mag. Res. Imag.* 1: 643–650 (1991).

When gradient moment nulling is applied to CPMG pulse sequences the result is unsatisfactory. Some reduction in flow artifacts usually results, but the amount of improvement varies considerably from scan-to-scan and the improvement is seldom as good as when gradient moment nulling is applied to conventional NMR pulse sequences.

SUMMARY OF THE INVENTION

The present invention relates to an improved CPMG NMR pulse sequence in which gradient moment nulling is employed to reduce motion artifacts in the reconstructed image. More specifically, the invention includes an NMR system for executing a CPMG pulse sequence in which a plurality of views are acquired, and nulling gradient pulses are applied during the pulse sequence such that the first moment of the nulling gradient pulses and imaging gradient pulses along an axis is substantially zero at the center of each RF refocusing pulse employed in the pulse sequence. The CPMG pulse sequence produces NMR echo signals which have a component due to the spin echo phenomenon (90°--180°) and a component due to the stimulated echo phenomenon (90°- -90°-2 -90°). The effects of flowing spins on the phase of these two components is different with the result that the two components can actually subtract from each other at echo signal acquisition. It has been discovered that conventional gradient moment nulling at the center of the acquired NMR echo signal properly compensates the spin echo component, but not the stimulated echo component. As a result, the stimulated echo component will retain flow induced phase errors that produce image artifacts. The discovery of the present invention is that the stimulated echo signal component can be properly compensated to offset the effects of flow by controlling the gradient first moment as measured at the center of each RF refocusing pulse in the CPMG sequence.

A general object of the invention is to reduce the image artifacts in a CPMG scan due to fluid motion. This is accomplished by nulling the first moment of one or more imaging gradients at each 180° RF refocusing pulse in the sequence. While the most dramatic improvement is achieved by nulling the gradient first moment at the centers of the RF refocusing pulses, further reduction of the flow artifacts can be achieved by also nulling at the center of each NMR echo signal.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIGS. 4A and 4B are graphic representations of two embodiments of the present invention as applied to the readout gradient pulses in the pulse sequence of FIG. 3;

FIGS. 5A and 5B are graphic representations of two embodiments of the present invention as applied to the slice select gradient pulses in the pulse sequence of FIG. 3.

DETAILED DESCRIPTION OF THE INVENTION

Figure 1:
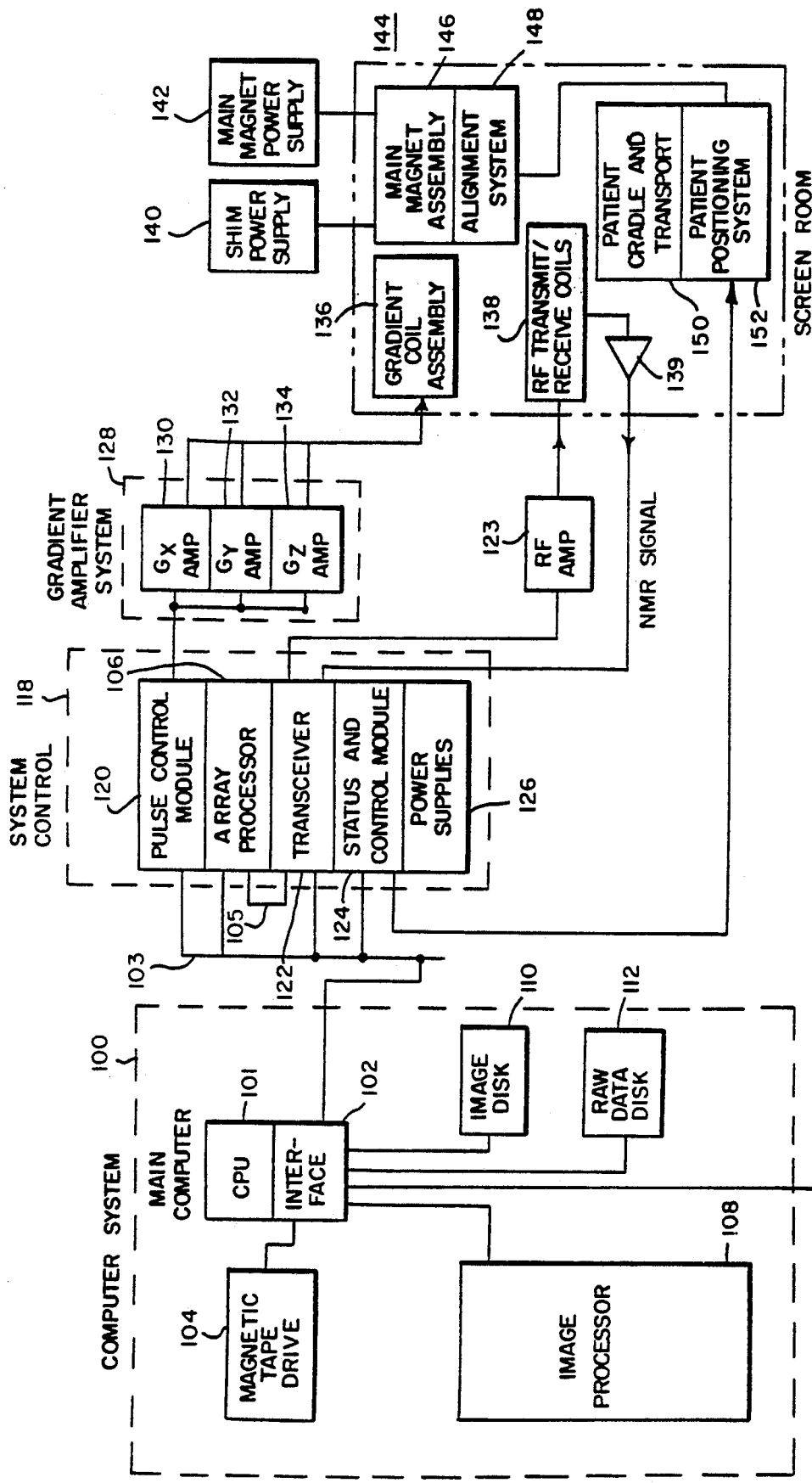
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

As will become apparent from the description below, to implement the present invention the magnetic field gradients are switched frequently and with a high degree of precision. As a result, efforts must be taken to reduce the effects of eddy currents caused by the rapid switching of these gradient fields. In the preferred embodiment, actively shielded gradient coils are employed as described in U.S. Pat. No. 4,737,716 entitled "Self- Shielded Gradient Coils For Nuclear Magnetic Resonance Imaging." In the alternative, gradient preemphasis techniques such as that described in U.S. Pat. No. 4,698,591 entitled "Method For Magnetic Field Gradient Eddy Current Compensation" can be employed to compensate for the effects of eddy currents.

The gradient magnetic fields are utilized in combination with radio frequency pulses generated by transceiver 122, RF amp 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize a shim coil associated with the main magnet and which are used to correct inhomogeneities in the polarizing magnet field. In the case of a superconductive magnet, the main power supply 142 is utilized to bring the polarizing field produced by the magnet to the proper operating strength and is then disconnected. The patient alignment system 148 operates in combination with a patient cradle and transport system 150 and patient positioning system 152. To minimize interference from external sources, these NMR system components are enclosed in an RF-shielded room generally designated 144.

Figure 2:
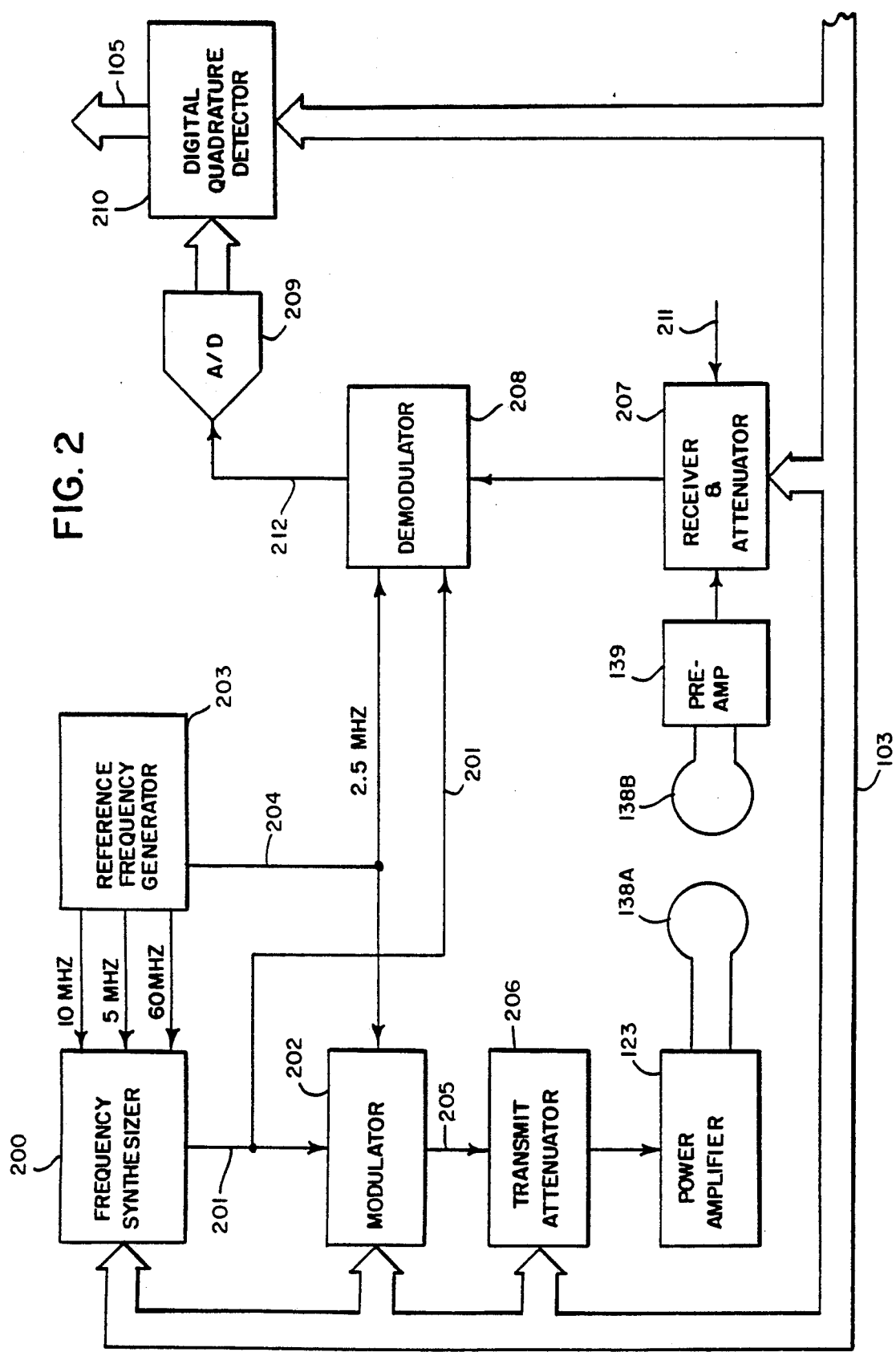
FIG. 2 is an electrical block diagram of the transceiver which forms part of the NMR system of FIG. 1.

Referring particularly to FIGS. 1 and 2, the transceiver 22 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF Carrier is applied to a modulator 202 where it is modulated in response to a signal R(t) received through the link 103 from the PCM 120. The signal R(t) defines the envelope, and therefore the bandwidth, of the RF excitation pulse to be produced. It is produced in the PCM 120 by sequentially reading out a series of stored digital values as the RF excitation pulse is produced that represent the desired envelope. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor where they are employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
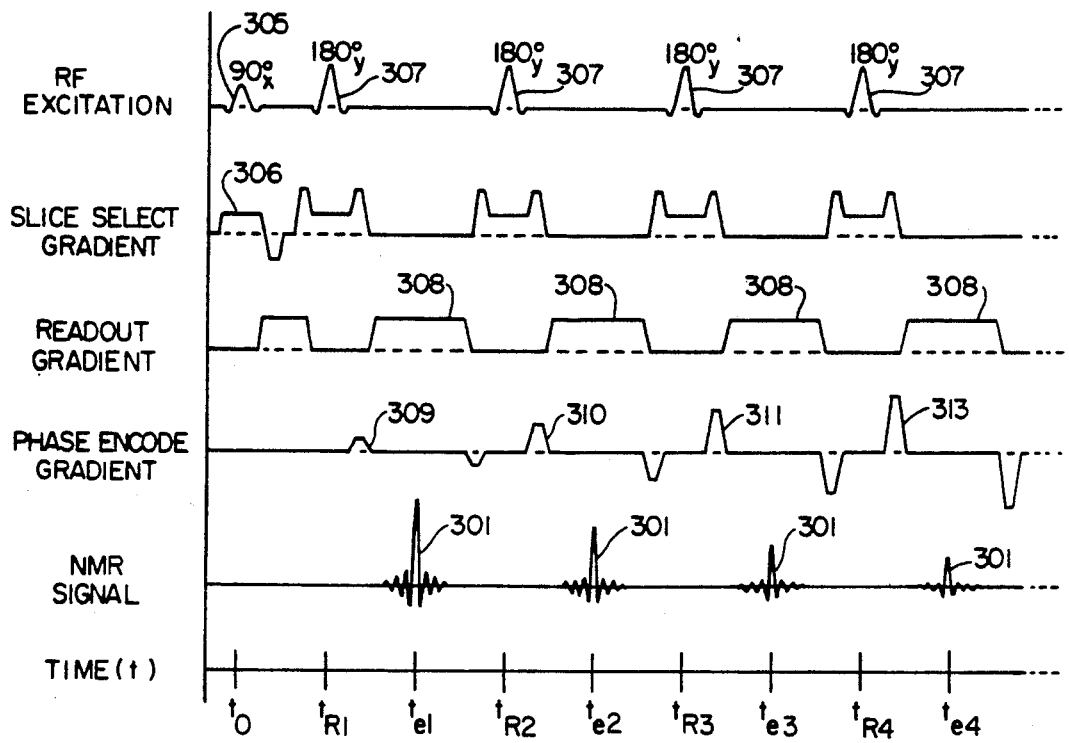
FIG. 3 is a graphic representation of a conventional fast spin echo pulse sequence.

Referring particularly to FIG. 3, a conventional fast spin echo NMR pulse sequence, referred to in the art as a 2DFT RARE sequence, is shown in which sixteen NMR echo signals are acquired. For clarity, only four echo signals 301 are shown in FIG. 3, but it can be appreciated that twelve more are produced and acquired. These NMR echo signals are produced by a 90° RF excitation pulse 305 which is generated in the presence of a $G_z$ slice select gradient pulse 306 to provide transverse magnetization in a slice through the patient. This transverse magnetization is refocused by each of sixteen selective 180° RF refocusing pulses 307 to produce the NMR spin echo signals 301 that are acquired in the presence of $G_x$ readout gradient pulses 308. In the preferred embodiment the 180° RF refocusing pulses 307 occur every 14 milliseconds, and the center of the first one occurs 7 milliseconds after the center of the 90° RF excitation pulse 305. Each NMR spin echo signal 301 is separately phase encoded by respective $G_y$ phase encoding pulses 309-313. The magnitude of each phase encoding pulse is different, and it is stepped through 256 values to acquire 256 separate views during a complete scan. Each NMR spin echo signal is acquired by digitizing 256 samples of each signal. As a result, at the completion of a scan for one image, 16 shots (256/16=16) of the pulse sequence of FIG. 3 have been executed and a 256 by 256 element array of complex numbers have been acquired. An image is reconstructed by performing a 2D Fourier transformation on this image data array and then calculating the absolute value of each resulting complex element. A 256 by 256 pixel image is thus produced in which the brightness of each pixel is determined by the magnitude of its corresponding element in the transformed array.

The present invention is an improvement in the CPMG NMR pulse sequence of FIG. 3 in which one or more of the gradient fields are changed to provide first moment nulling at each of the 180° RF refocusing pulses 307. In alternative preferred embodiments described below, the first moment of the gradient fields are also nulled at each of the NMR echo signals 301 to further reduce image artifacts due to flowing spins.

The first moment of a gradient field G(t) is given by the following expression:

$$M_1 = \int_{\infty}^{\infty} G(t)t\, dt$$

where:
G = amplitude of gradient filed
t = time

To null the phase errors which the gradient G(t) will impose on the NMR signals produced by moving spins, this expression should equal zero over the time interval in which the spins are transversely magnetized. Referring to FIG. 3, transverse magnetization may be considered to be produced at the center of the 90° RF excitation pulse 305 at time $t_o$, this magnetization is reversed by the 180° RF refocusing pulse 307 at time $t_{R1}$, and the first NMR echo signal 301 is acquired about the time $t_{e1}$. A second RF refocusing pulse is applied at time $t_{R2}$, a second NMR echo signal is acquired at time $t_{e2}$, and the sequence repeats until all NMR echo signals 301 in the shot have been acquired. It is a fundamental teaching of the present invention that the above expression for the gradient first moment be controlled for the time period $t_o$ to $t_{R1}$ and for each subsequent time period between RF refocusing pulses 307 ($t_{R1}$ to $t_{R2}$, $t_{R2}$ to $t_{R3}$, ... $t_{Rn-1}$ to $t_{Rn}$). In the preferred embodiment, the gradient first moment is controlled by setting it to zero during each of the relevant time intervals.

The phase errors due to flowing spins can be further reduced if the above expression for the gradient first moment is substantially zero for the time interval between transverse excitation $t_o$ and the center of the first NMR echo signal $t_{e1}$, and for each subsequent time interval between NMR echo signals ($t_{e1}$ to $t_{e2}$, $t_{e2}$ to $t_{e3}$, ... $t_{en-1}$ to $t_{en}$). The entire gradient field can be nulled to offset the phase errors due to spins moving in any direction, or the gradient field along one or two axes of motion can be nulled to offset phase errors due to spin motion along those axes alone.

Figure 4A:
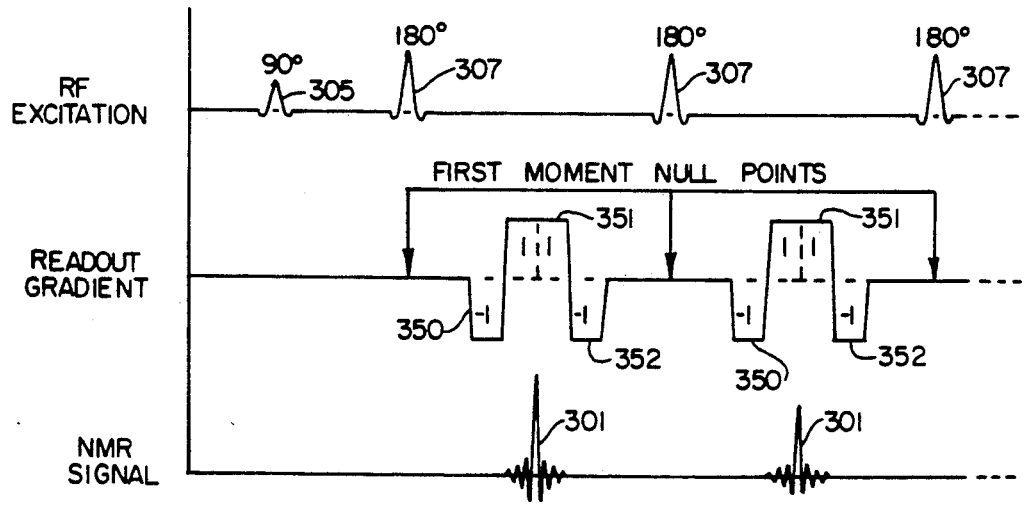

Referring particularly to FIG. 4A, the application of the present invention to the readout gradient in the fast spin echo pulse sequence of FIG. 3 is shown. In this embodiment the −1, +2, −1 symmetric readout gradient pulses 350, 351 and 352 are applied at each echo signal 301 to null the first moment of the readout gradient at the center of the subsequent RF refocusing pulse 307. As a result, the relative phase of the stimulated echo component and the spin echo component in subsequent NMR echo signals is not affected by the velocity of spins flowing in the direction of the readout gradient. However, in this embodiment the first moment of the readout gradient is not nulled at the center of the NMR echo signals, and the phase of the NMR echo signal will be affected by the velocity of spins flowing in the direction of the readout gradient.

An alternative embodiment of the invention as applied to the readout gradient is shown in FIG. 4B. In this embodiment the 1, −2, +2, −2, 1 symmetric readout gradient pulses 355-359 are applied at each NMR echo signal 301 to null the first moment at the subsequent RF refocusing pulse 307. In addition, however, the 1, −2, 1 symmetric readout gradient pulses 355, 356 and the first half of pulse 357, null the first moment at the center of the NMR echo signal 301. Consequently, the relative phase of both the stimulated echo component and the spin echo component of the NMR echo signals 301 are substantially unaffected by the velocity of spins flowing in the readout gradient direction and the phase of the NMR echo signals 301 are also unaffected.

Referring particularly to FIG. 5A, the present invention may also be employed with the slice select gradient to null the first gradient moment at each RF refocusing pulse 307. The second half 360 of a slice select gradient pulse 361 forms the first pulse in a 1, −2, 1 symmetric slice select gradient comprised of pulses 360, 362 and 363. These symmetric pulses have a zero first moment at the center of the first RF refocusing pulse 307. The pulse 363 functions as the first half of a slice select gradient pulse 364 which is aligned with the center of the first RF refocusing pulse 307, and the second half 365 forms the first pulse in a 1, −1, −1, 1 symmetric slice select gradient comprised of pulses 365, 366, 367 and 368. The first moment of these gradient pulses 365-368 is zero at the center of the second RF refocusing pulse 307, and this same 1, −1, −1, 1 symmetric gradient pulse pattern is repeated between each of the remaining RF refocusing pulses 307 in the sequence. As a result, the first moment of the slice select gradient is nulled at the center of each RF refocusing pulse 307 to eliminate relative phase shifts between the stimulated echo component of each NMR echo signal 301 and the spin echo component caused by the velocity of spins flowing in the direction of the slice select gradient.

An alternative embodiment of the invention as applied to the slice select gradient is shown in FIG. 5B. In this case, the first moment of the slice select gradient is nulled at the RF refocusing pulses 307 as well as the center of each NMR echo signal 301. This is accomplished by employing two 1, −2, 1 symmetric gradient pulse patterns 370 and 371 between successive RF refocusing pulses 307 as shown. In this embodiment, phase shifts in both the stimulated echo signal component and the spin echo signal component due to the flow of spins along the direction of the slice select gradient are minimized.

Figure 6:
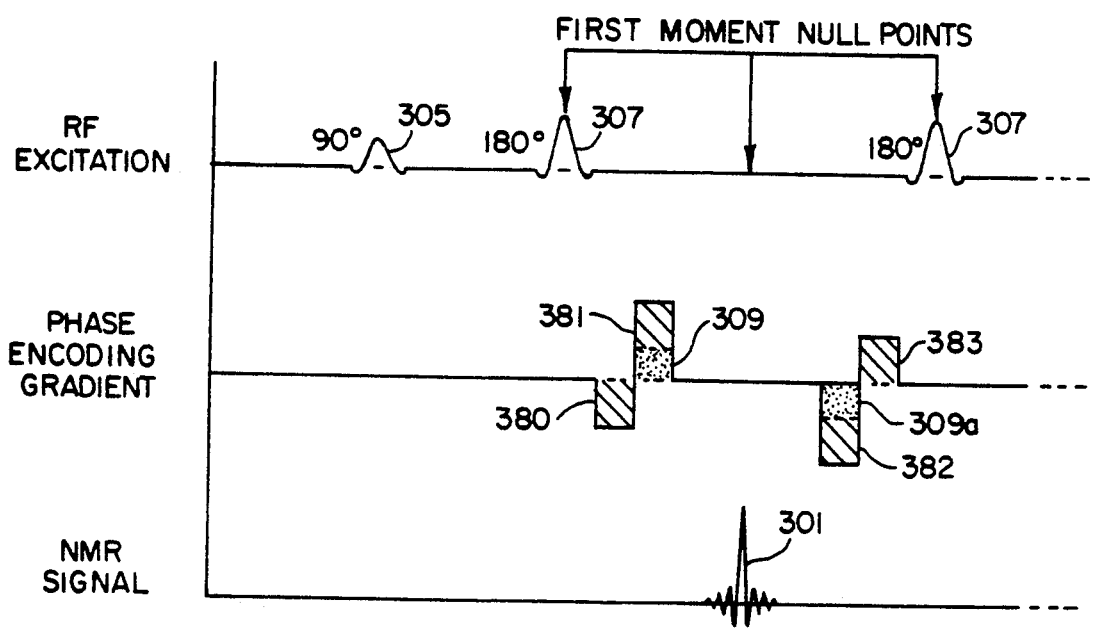
FIG. 6 is a graphic representation of a preferred embodiment of the present invention as applied to the phase encoding gradient pulses in the pulse sequence of FIG. 3.

The present invention may also be applied to the phase encoding gradient as illustrated in FIG. 6. The phase encoding pulse 309 is produced just prior to each NMR echo signal 301, and as explained above, its size (i.e. area) changes for each of the 256 acquired signals in the scan. A corresponding rewinder gradient pulse 309a follows each NMR echo signal 301, and it has the same size, but opposite polarity of the phase encoding gradient pulse 309. These gradient pulses 309 and 309a are compensated for velocity by adding the bipolar gradient pulses 380 and 381 to the phase encoding pulse 309, and the opposite bipolar gradient pulses 382 and 383 to the rewinder pulse 309a. The first moment of the pulses 309, 380, 381, 309a, 382 and 383 is substantially zero over the interval between the 180° RF refocusing pulses to null the effect of spin velocity along the phase encoding direction and maintain the proper phase relationship between the stimulated echo component and spin echo component of the NMR signal.

The compensated phase encoding pulses of FIG. 6 also nulls the first moment of the phase encoding gradient at the center of each NMR echo signal 301. In this instance the zeroth moment is non-zero at the center of each NMR echo signal 301 to impart a phase shift to the signal which indicates the position of the spins along the Y axis. In the preferred embodiment, the gradient components 380 and 381 added to achieve moment nulling are three times the area of the uncompensated phase encoding pulse 309; and this added area is split evenly between the two pulse components 380 and 381. The same relationship applies to the rewinder components 309a, 382 and 383.

While the present invention has been explained with reference to a number of preferred embodiments, it can be appreciated that many variations from the preferred embodiments are possible without departing from the spirit of the invention. For example, while the first moment of the gradient field is nulled to offset the effects of spin velocity, it is also possible to null higher moments to offset the effects of higher order motion such as acceleration or jerk. Also, while the first moment of the gradient has been nulled in the preferred embodiments, this is not the only solution. To maintain the proper phase relationship between the spin echo component and the stimulated echo component of the NMR signal, it is only necessary to maintain a proper relationship between the first moment of the gradient produced during the interval between the RF excitation pulse 305 and the first RF refocusing pulse 307 and during the interval between any pair of RF refocusing pulses 307. More specifically, in a CPMG pulse sequence the phase relationship will be maintained if the first moment of the gradient between RF refocusing pulses 307 is made twice the first moment of the same gradient produced before the first RF refocusing pulse 307. Setting the first moment to zero is but one possible solution, although it is clearly the preferred solution at the present time.

While the particular fast spin echo pulse sequence disclosed herein is the preferred embodiment of the invention, variations are possible. For example, the RF excitation and RF refocusing pulses need not be exactly 90° and 180°, but instead, may be reduced in some sequences to reduce the RF deposition in the patient. Also, other pulse sequences which utilize the CPMG sequence to form multiple NMR echo signals may employ the present invention. For example, the present invention may be employed in a multiple echo sequence such as MEMP where the crusher gradients normally used to suppress the stimulated echo signal component may be removed and the present invention applied to insure that the stimulated echo signal component maintains its proper phase relationship with the spin echo component. The present invention may also improve CPMG pulse sequences employed to measure $T_2$ relaxation times and employed in NMR spectroscopy.

I claim:

1. A method of suppressing image artifacts caused by flowing nuclear spins which produce phase errors in the NMR echo signals acquired during a CPMG pulse sequence, the method comprising:
   a) producing transverse magnetization in a region of interest by applying an RF excitation field pulse to the nuclear spins in the region of interest in the presence of a first magnetic field gradient and a polarizing magnetic field;
   b) refocusing the transverse magnetization by applying a series of RF refocusing field pulses to the nuclear spins in the region of interest to produce a corresponding series of NMR echo signals;
   c) phase encoding each NMR echo signal by applying a second magnetic field gradient to the nuclear spins in the region of interest during the interval after each RF refocusing field pulse and prior to its corresponding NMR echo signal;
   d) acquiring each NMR echo signal in the presence of a third magnetic field gradient; and
   e) modifying at least one of said first, second and third magnetic field gradients such that the first moment of said magnetic field gradient is substantially zero at the center of each of said RF refocusing field pulses.

2. The method as recited in claim 1 which further includes:
   f) modifying at least one of said first, second and third magnetic field gradients such that the first moment of said magnetic field gradient is also substantially zero at the center of each of said NMR echo signals.

3. The method as recited in claim 1 in which a higher moment of said at least one magnetic field gradient is substantially zero at the center of each of said RF refocusing field pulses.

4. The method as recited in claim 1 in which a plurality of said magnetic field gradients are modified such that their first moment is substantially zero at the center of each of said RF refocusing field pulses.

5. A method of suppressing image artifacts caused by flowing nuclear spins which produce phase errors in the NMR echo signals acquired during an NMR pulse sequence, the method comprising:
   a) producing transverse magnetization in a region of interest by applying an RF excitation field pulse to the nuclear spins in the region of interest in the presence of a first magnetic field gradient and a polarizing magnetic field;
   b) refocusing the transverse magnetization by applying a series of RF refocusing field pulses to the nuclear spins in the region of interest to produce a corresponding series of NMR echo signals;
   c) phase encoding each NMR signal by applying a second magnetic field gradient to the nuclear spins in the region of interest during the interval after each RF refocusing field pulse and prior to its corresponding NMR echo signal;
   d) acquiring each NMR echo signal in the presence of a third magnetic field gradient; and
   e) modifying at least one of said first, second and third magnetic field gradients such that the first moment of said magnetic field gradient as measured between the centers of each successive pair of said RF refocusing field pulses is twice the first moment of the same magnetic field gradient as measured between the center of said RF excitation field pulse and the center of said first RF refocusing field pulse.

6. The method as recited in claim 5 in which the NMR pulse sequence is a fast spin echo pulse sequence.

7. The method as recited in claim 5 which further includes:
   f) modifying at least one of said first, second and third magnetic field gradients such that the first moment of said magnetic field gradient is substantially zero at the center of each of said NMR echo signals.

8. The method as recited in claim 5 in which a plurality of said magnetic field gradients are modified as set forth in step e).

* * * * *